(12) United States Patent
Murdock et al.

(10) Patent No.: US 11,955,687 B2
(45) Date of Patent: Apr. 9, 2024

(54) STRUCTURAL ARRANGEMENTS FOR SPATIAL POWER-COMBINING DEVICES

(71) Applicant: Qorvo US, Inc., Greensboro, NC (US)

(72) Inventors: Dylan Murdock, Bend, OR (US); Gregory Valenti, Richardson, TX (US); Eric Jackson, Moorpark, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/571,980

(22) Filed: Jan. 10, 2022

(65) Prior Publication Data

US 2023/0223673 A1    Jul. 13, 2023

(51) Int. Cl.
*H01P 5/18*     (2006.01)
*H01P 3/06*     (2006.01)
*H03F 3/21*     (2006.01)

(52) U.S. Cl.
CPC .............. *H01P 5/183* (2013.01); *H01P 3/06* (2013.01); *H03F 3/21* (2013.01)

(58) Field of Classification Search
CPC .............. H01P 5/183; H01P 3/06; H03F 3/21
See application file for complete search history.

(56) References Cited

U.S. PATENT DOCUMENTS

| | | |
|---|---|---|
| 3,023,382 A | 2/1962 | Borghetti |
| 4,234,854 A | 11/1980 | Schellenberg et al. |
| 4,424,496 A | 1/1984 | Nichols et al. |
| 4,612,512 A | 9/1986 | Powell et al. |
| 4,724,400 A | 2/1988 | Luettgenau |
| 5,036,335 A | 7/1991 | Jairam |
| 5,162,803 A | 11/1992 | Chen |
| 5,214,394 A | 5/1993 | Wong |
| 5,256,988 A | 10/1993 | Izadian |

(Continued)

FOREIGN PATENT DOCUMENTS

| | | |
|---|---|---|
| EP | 2469996 A2 | 6/2012 |
| EP | 3279597 A1 | 2/2018 |
| EP | 3454370 A1 | 3/2019 |
| FR | 3040242 A1 | 2/2017 |
| WO | 2017214357 A2 | 12/2017 |
| WO | 2018134495 A1 | 7/2018 |

OTHER PUBLICATIONS

Advisory Action, Examiner-Initiated Interview Summary, and AFCP 2.0 Decision for U.S. Appl. No. 16/191,541, dated May 21, 2020, 5 pages.

(Continued)

*Primary Examiner* — Samuel S Outten
(74) *Attorney, Agent, or Firm* — Withrow & Terranova, P.L.L.C.

(57) ABSTRACT

Power-combining devices, and more particularly spatial power-combining and related structural arrangements are disclosed. Such structural arrangements involve mechanical connections between center waveguide sections and input and/or output coaxial waveguide sections that provide scalable structures for different operating frequency bands, improved mechanical connections, and/or improved assembly. Exemplary structural arrangements include structures that extend through center waveguide sections and into input and/or output coaxial waveguide sections, integrated mechanical structures within the center waveguide section, compression fit arrangements, dielectric inserts arranged within channels of coaxial waveguide sections, and/or various combinations thereof.

12 Claims, 9 Drawing Sheets

(56) References Cited

U.S. PATENT DOCUMENTS

| | | | |
|---|---|---|---|
| 5,736,908 | A | 4/1998 | Alexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 8,801,922 | B2 | 8/2014 | Wrazel et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,293,801 | B2 | 3/2016 | Courtney et al. |
| 9,325,074 | B2 | 4/2016 | Chandler |
| 9,547,344 | B2 | 1/2017 | Han |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1* | 12/2018 | Kitt ......................... H04B 1/04 |
| 10,263,651 | B1 | 4/2019 | Kitt |
| 10,340,574 | B2 | 7/2019 | Mohan et al. |
| 10,454,433 | B2 | 10/2019 | Kitt |
| 2002/0118520 | A1 | 8/2002 | Baker |
| 2004/0108903 | A1 | 6/2004 | Channabasappa et al. |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2010/0065256 | A1 | 3/2010 | Wilcoxon et al. |
| 2011/0300230 | A1 | 12/2011 | Peterson et al. |
| 2013/0003309 | A1 | 1/2013 | Stella |
| 2013/0127678 | A1 | 5/2013 | Chandler |
| 2014/0145794 | A1 | 5/2014 | Courtney et al. |
| 2014/0145795 | A1 | 5/2014 | Behan et al. |
| 2014/0167880 | A1 | 6/2014 | Daughenbaugh, Jr. et al. |
| 2014/0347145 | A1 | 11/2014 | Nakamura et al. |
| 2015/0270817 | A1 | 9/2015 | Campbell |
| 2017/0149113 | A1 | 5/2017 | Theveneau et al. |
| 2017/0179598 | A1 | 6/2017 | Kitt |
| 2018/0187984 | A1 | 7/2018 | Manzo |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |
| 2019/0081453 | A1 | 3/2019 | Meehan et al. |
| 2019/0140356 | A1 | 5/2019 | Mohan |
| 2019/0312327 | A1 | 10/2019 | Kitt |
| 2020/0041209 | A1 | 2/2020 | Valenti et al. |
| 2020/0041210 | A1 | 2/2020 | Valenti et al. |
| 2020/0162046 | A1 | 5/2020 | Bojkov et al. |
| 2020/0185803 | A1 | 6/2020 | Mohan et al. |
| 2020/0274506 | A1 | 8/2020 | Yoon et al. |
| 2021/0297048 | A1 | 9/2021 | Yoon et al. |
| 2021/0298207 | A1 | 9/2021 | Murdock |

OTHER PUBLICATIONS

Final Office Action for U.S. Appl. No. 16/191,541, dated Mar. 31, 2020, 8 pages.
Non-Final Office Action for U.S. Appl. No. 16/191,541, dated Dec. 9, 2019, 7 pages.
Espera Jr., A.H. et al., "3D-printing and advanced manufacturing for electronics," Progress in Additive Manufacturing, Feb. 4, 2019, Springer, 24 pages.
Glasschroeder, J. et al., "Powder-bed-based 3D-printing of function integrated parts," Rapid Prototyping Journal, vol. 21, Issue 2, Emerald Group Publishing Limited, pp. 207-215.
Leigh, S.J. et al., "A Simple, Low-Cost Conductive Composite Material for 3D Printing of Electronic Sensors," PLoS One, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Notice of Allowance for U.S. Appl. No. 16/288,735, dated Oct. 29, 2020, 7 pages.
Non-Final Office Action for U.S. Appl. No. 16/288,735, dated May 3, 2021, 8 pages.
Non-Final Office Action for U.S. Appl. No. 16/288,761, dated Apr. 1, 2021, 8 pages.
Examiner-Initiated Interview Summary for U.S. Appl. No. 16/288,761, dated Jun. 18, 2021, 2 pages.
Notice of Allowance for U.S. Appl. No. 16/288,761, dated Jun. 29, 2021, 7 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.
Notice of Allowance for U.S. Appl. No. 16/284,214, dated Jan. 6, 2021, 7 pages.
Non-Final Office Action for U.S. Appl. No. 16/928,092, dated Oct. 27, 2021, 5 pages.
Notice of Allowance for U.S. Appl. No. 16/928,092, dated Mar. 30, 2022, 7 pages.
Notice of Allowance for U.S. Appl. No. 16/288,735, dated Sep. 29, 2021, 8 pages.
Non-Final Office Action for U.S. Appl. No. 16/820,880, dated Nov. 19, 2021, 10 pages.
Notice of Allowance for U.S. Appl. No. 16/820,880, dated Mar. 2, 2022, 8 pages.
Non-Final Office Action for U.S. Appl. No. 16/821,531, dated Nov. 10, 2021, 15 pages.
Notice of Allowance for U.S. Appl. No. 16/821,531, dated Mar. 10, 2022, 8 pages.
Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.
Leggieri, Alberto et al., "The Squarax Spatial Power Combiner," Progress In Electromagnetics Research C, vol. 45, Oct. 2013, EMW Publishing, pp. 43-55.
Ortiz, Sean C., "High Power Spatial Combiners: Tile and Tray Approaches," Dissertation, North Carolina State University, Electrical Engineering, Nov. 2001, 194 pages.
Notice of Allowance for U.S. Appl. No. 15/290,749, dated Feb. 16, 2018, 9 pages.
Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.
Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.
Fathy, A., et al., "A Simplified Approach for Radial Power Combiners," IEEE Transactions on Microwave Theory and Techniques, vol. 54, No. 1, Jan. 2006, pp. 247-255.

(56) References Cited

OTHER PUBLICATIONS

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.
Tribak, A., et al., "Ultra-Broadband High Efficiency Mode Converter," Progress in Electromagnetics Research C, vol. 36, 2013, pp. 145-158.
Montgomery, R., et al., "Solid-State PAs Battle TWTAs for ECM Systems," Microwave Journal, Jun. 2017 Supplement, Jun. 14, 2017, 3 pages.
Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Author Unknown, "Interpack 2005: An assessment for PMMI members," 2005, PMMI, 32 pages.
Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.
Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.
Larkins, Grover, et al., "Evidence of Superconductivity in Doped Graphite and Graphene," Superconductor Science and Technology, vol. 29, Issue 1, Dec. 2015, IOP Publishing Ltd, 18 pages.
Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 16/005,794, dated Oct. 7, 2019, 11 pages.
Notice of Allowance for U.S. Appl. No. 16/005,794, dated Jan. 9, 2020, 7 pages.
Corrected Notice of Allowability and Examiner-Initiated Interview Summary for U.S. Appl. No. 16/005,794, dated May 26, 2020, 6 pages.
Non-Final Office Action for U.S. Appl. No. 16/032,252, dated Dec. 27, 2019, 5 pages.
Notice of Allowance for U.S. Appl. No. 16/032,252, dated Jun. 1, 2020, 7 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Notice of Allowance for U.S. Appl. No. 16/008,586, dated Feb. 4, 2020, 8 pages.
Corrected Notice of Allowance and Examiner-Initiated Interview Summary for U.S. Appl. No. 15/846,840, dated Dec. 12, 2019, 6 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Non-Final Office Action for U.S. Appl. No. 15/981,516, dated Jul. 17, 2019, 5 pages.
Notice of Allowance for U.S. Appl. No. 15/981,516, dated Jan. 15, 2020, 7 pages.
Non-Final Office Action for U.S. Appl. No. 15/933,821, dated Jul. 11, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Notice of Allowance for U.S. Appl. No. 16/821,531, dated Sep. 20, 2022, 8 pages.
Non-Final Office Action for U.S. Appl. No. 17/663,878, dated Sep. 23, 2022, 10 pages.
Notice of Allowance for U.S. Appl. No. 17/245,114, dated Nov. 23, 2022, 10 pages.
Notice of Allowance and Examiner-Initiated Interview Summary for U.S. Appl. No. 17/663,878, dated Jan. 20, 2023, 9 pages.
Non-Final Office Action for U.S. Appl. No. 16/821,531, dated Jun. 16, 2022, 15 pages.
U.S. Appl. No. 17/245,114, filed Apr. 30, 2021.
Extended European Search Report for European Patent Application No. 23158619.9, dated Jul. 17, 2023, 9 pages.

\* cited by examiner

STRUCTURAL ARRANGEMENTS FOR SPATIAL POWER-COMBINING DEVICES

FIELD OF THE DISCLOSURE

The disclosure relates generally to power-combining devices and, more particularly, to spatial power-combining devices with increased output power.

BACKGROUND

Solid state power amplifiers (SSPAs) are used for broadband radio frequency power amplification in commercial and defense communications, radar, electronic warfare, satellite, and various other communication systems. As modern SSPA applications continue to advance, increasingly higher and higher saturated output power is desired. While millimeter wave (mmWave) gallium nitride (GaN) monolithic microwave integrated circuits (MMICs) have made great strides for use in SSPAs, there are many applications where even higher power densities may be out of reach for a single device. Spatial power-combining devices have been developed that provide a means to combine the output of several separate MMICs to realize a SSPA with much larger output power than that of a single device. Spatial power-combining techniques are implemented by combining broadband signals from a number of amplifiers to provide output powers with high efficiencies and operating frequencies.

One example of a spatial power-combining device utilizes a plurality of solid-state amplifier assemblies that forms a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array. In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures is related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges.

The art continues to seek improved spatial power-combining devices having improved performance characteristics while being capable of overcoming challenges associated with conventional devices.

SUMMARY

Aspects disclosed herein relate to power-combining devices, and more particularly to structural arrangements of spatial power-combining devices. Such structural arrangements involve mechanical connections between center waveguide sections and input and/or output coaxial waveguide sections that provide scalable structures for different operating frequency bands, improved mechanical connections, and/or improved assembly. Exemplary structural arrangements include structures that extend through center waveguide sections and into input and/or output coaxial waveguide sections, integrated mechanical structures within the center waveguide section, compression fit arrangements, dielectric inserts arranged within channels of coaxial waveguide sections, and/or various combinations thereof.

In one aspect, a spatial power-combining device comprises: a center waveguide section comprising a plurality of amplifier assemblies, wherein the plurality of amplifier assemblies form a first end and a second end; a first coaxial waveguide section attached to the first end; a second coaxial waveguide section attached to the second end; and a mechanical fastener at least partially arranged within the center waveguide section such that the plurality of amplifier assemblies are arranged radially around the mechanical fastener, wherein a threaded portion of the mechanical fastener is threaded into the first coaxial waveguide section and a head of the mechanical fastener is fixed within the second coaxial waveguide section. In certain embodiments, each amplifier assembly of the plurality of amplifier assemblies comprises an input antenna structure, an amplifier, and an output antenna structure. In certain embodiments, the first coaxial waveguide section comprises a first outer conductor and a first inner conductor that form a first channel therebetween; and the second coaxial waveguide section comprises a second outer conductor and a second inner conductor that form a second channel therebetween. In certain embodiments, the second inner conductor comprises a first portion and a second portion that is attached to the first portion; and the head of the mechanical fastener is arranged between the first portion and the second portion of the second inner conductor within the second coaxial waveguide section. In certain embodiments, the threaded portion of the mechanical fastener is secured to the first inner conductor. In certain embodiments, the first inner conductor comprises a first portion and a second portion that is attached to the first portion; and the threaded portion of the mechanical fastener is secured to the first portion of the first inner conductor. In certain embodiments, the threaded portion of the mechanical fastener is secured to both the first portion and the second portion of the first inner conductor. In certain embodiments, the mechanical fastener comprises a bolt.

In another aspect, a spatial power-combining device comprises: a center waveguide section comprising a plurality of amplifier assemblies, wherein the plurality of amplifier assemblies form a first end and a second end, and wherein each amplifier assembly of the plurality of amplifier assemblies comprises: an input antenna structure, an amplifier, and an output antenna structure; and a body that supports the input antenna structure, the amplifier, and the output antenna structure, wherein a portion of the body that is proximate the first end forms a first slot that is spaced from the first end, and wherein the first slot of each amplifier assembly of the plurality of amplifier assemblies forms a first radial cavity that is spaced from the first end; a first coaxial waveguide section attached to the first end by a first mechanical fastener; and a first nut that is arranged within the first radial cavity, wherein the first nut receives a portion of the first mechanical fastener. In certain embodiments, a total number of planar lateral edges of the first nut is the same as a total number of amplifier assemblies of the plurality of amplifier assemblies. In certain embodiments, another portion of the body of each amplifier assembly that is proximate the second end forms a second slot that is spaced from the second end, and wherein the second slot of each amplifier assembly of the plurality of amplifier assemblies forms a second radial cavity that is spaced from the second end. The spatial power-combining device may further comprise a second coaxial waveguide section attached to the second end by a second mechanical fastener; and a second nut that is arranged within the second radial cavity, wherein the second nut receives a portion of the second mechanical fastener. In certain embodiments, a total number of planar lateral edges of the second nut is less than or equal to a total number of amplifier assemblies of the plurality of amplifier assemblies. In certain embodiments, each of the first mechanical fastener and the second mechanical fastener comprises a bolt. In certain embodiments, the first nut is formed with a protruding feature that is oriented toward the first coaxial waveguide section.

In another aspect, a spatial power-combining device comprises: a center waveguide section comprising a plurality of amplifier assemblies, wherein the plurality of amplifier assemblies form a first end and a second end; and a first coaxial waveguide section comprising a first inner conductor and a first outer conductor that is separated from the first inner conductor to form a first channel within the first coaxial waveguide section, wherein the first inner conductor is mechanically coupled to the first end by only a compression fit connection. In certain embodiments, the compression fit connection is at least partially provided by outer mechanical fasteners that couple the first outer conductor to the center waveguide section. In certain embodiments, the compression fit connection is further provided by a pin that is arranged between the first outer conductor and the first inner conductor. In certain embodiments, each amplifier assembly of the plurality of amplifier assemblies comprises a body structure that supports an input antenna structure, an amplifier, and an output antenna structure; and the compression fit connection is further provided by an alignment notch formed in the body structure that receives a corresponding protruding feature of the first inner conductor.

In another aspect, a spatial power-combining device comprises: a center waveguide section comprising a plurality of amplifier assemblies, wherein the plurality of amplifier assemblies form a first end and a second end; a first coaxial waveguide section comprising a first inner conductor and a first outer conductor that is separated from the first inner conductor to form a first channel within the first coaxial waveguide section; and a dielectric insert arranged within the first channel, wherein the dielectric insert is configured to form at least a portion of a medium in which a signal propagates through the first coaxial waveguide section. In certain embodiments, the dielectric insert occupies only a portion of the first channel. In certain embodiments, the dielectric insert forms a band within the portion of the first channel. In certain embodiments, the dielectric insert forms a plurality of tines that extend within the first channel. In certain embodiments, the plurality of tines are connected by at least one band that resides within the first channel. In certain embodiments, the first inner conductor is mechanically coupled to the first end by a compression fit connection. In certain embodiments, the dielectric insert occupies an entire portion of the first channel in which the signal propagates through the first coaxial waveguide section.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
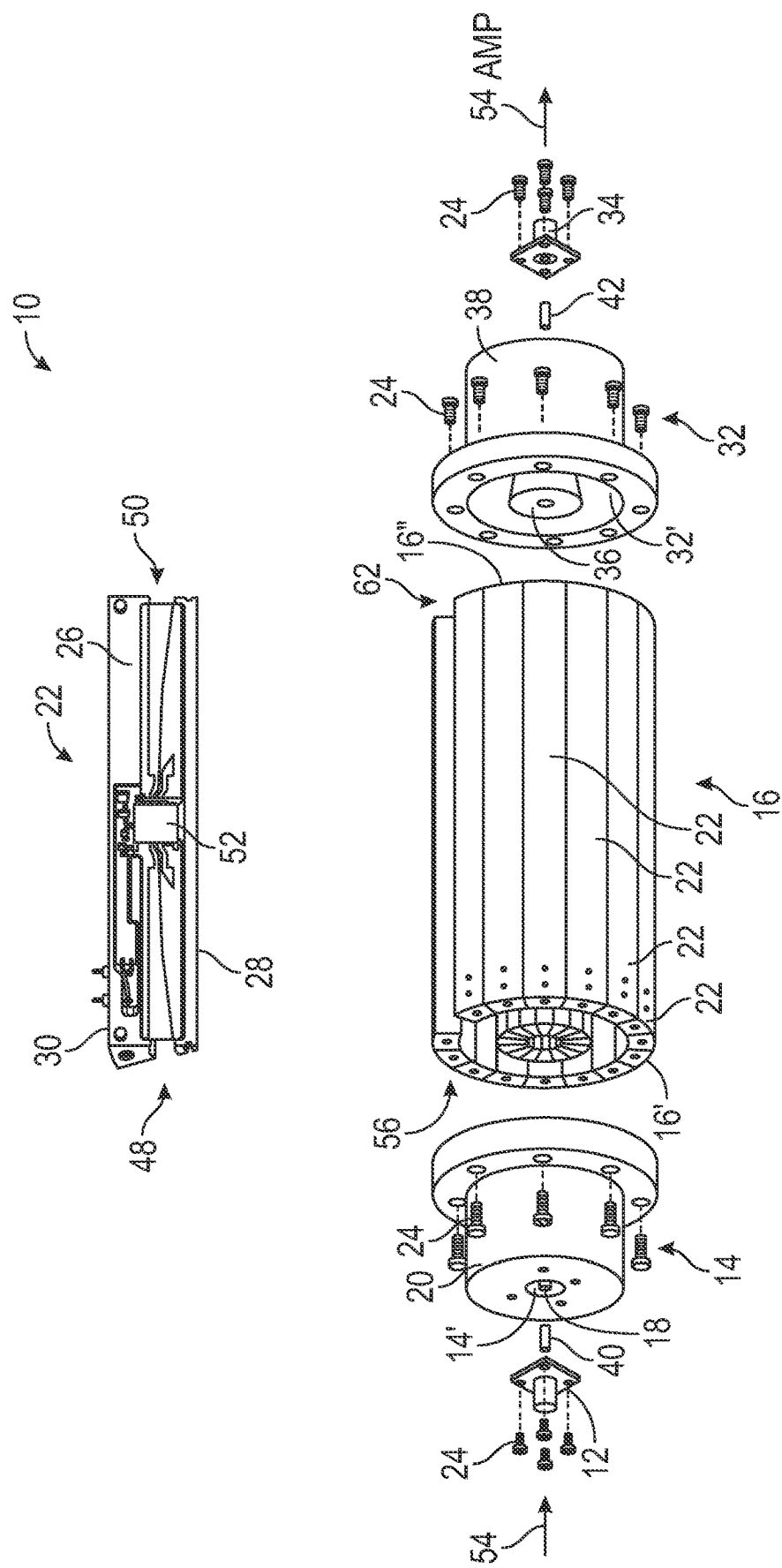
FIG. 1A is a partially-exploded perspective view of an exemplary spatial power-combining device according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to power-combining devices, and more particularly to structural arrangements of spatial power-combining devices. Such structural arrangements involve mechanical connections between center waveguide sections and input and/or output coaxial waveguide sections that provide scalable structures for different operating frequency bands, improved mechanical connections, and/or improved assembly. Exemplary structural arrangements include structures that extend through center waveguide sections and into input and/or output coaxial waveguide sections, integrated mechanical structures within the center waveguide section, compression fit arrangements, dielectric inserts arranged within channels of coaxial waveguide sections, and/or various combinations thereof.

Aspects of the present disclosure are particularly adapted to spatial power-combining devices that operate at microwave frequencies, such as, by way of a non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. In some embodiments, by way of non-limiting examples, the operating frequency range includes an operating bandwidth of 4 GHz to 40 GHz, or 2 GHz to 18 GHz, or 2 GHz to 20 GHz, or 25 to 40 GHz, among others.

A spatial power-combining device typically includes a plurality of amplifier assemblies, and each amplifier assembly typically comprises an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are typically arranged coaxially about a center axis. Accordingly, the spatial power-combining device is configured to split, amplify, and combine an electromagnetic signal.

In the following figures, the terms "input" and "output" are generally used to refer to various portions of spatial power-combining devices, where the term "input" is used to describe elements that reside along portions of spatial power-combining devices where signals may propagate before amplification and the term "output" is used to describe elements that reside along portions of spatial power-combining devices where signals may propagate after amplification. In various embodiments as described herein, portions of spatial power-combing devices may exhibit some levels of symmetry between "input" portions and "output" portions. In this regard, descriptions relative to "input" elements may also be applicable to corresponding "output" elements and vice versa. Accordingly, the terms "input" and "output" as used herein may also be replaced with the terms "first" and "second" without deviating from the principles disclosed.

FIG. 1A is a partially-exploded perspective view of an exemplary spatial power-combining device 10. The spatial power-combining device 10 may comprise an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance of the input port 12 to an impedance of the center waveguide section 16. The input coaxial waveguide section 14 may include an inner conductor 18 and an outer conductor 20 that radially surrounds the inner conductor 18, thereby forming an opening or channel 14' therebetween. Outer surfaces of the inner conductor 18 and an inner surface of the outer conductor 20 may have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. As illustrated, the plurality of amplifier assemblies 22 form a first end 16', or input end, of the center waveguide section 16 and an opposing second end 16", or output end, of the center waveguide section 16. The input coaxial waveguide section 14, and in particular, the outer conductor 20 may be attached to the first end 16' by way of outer mechanical fasteners 24, such as screws, bolts, or the like that engage with corresponding portions of the amplifier assemblies 22. Each amplifier assembly 22 may include a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 may also comprise an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. The input port 12 and the output port 34 may be mechanically coupled respectively to the input coaxial waveguide section 14 and the output coaxial waveguide section 32 by way of additional outer mechanical fasteners 24. In embodiments where the operating frequency range includes a frequency of at least 18 gigahertz (GHz), the output port 34 may comprise a waveguide output port, such as a WR28 or other sized waveguide.

The output coaxial waveguide section 32 provides a broadband transition from the center waveguide section 16 to the output port 34. Electrically, the output coaxial waveguide section 32 provides broadband impedance matching from the impedance of the center waveguide section 16 to an impedance of the output port 34. The output coaxial waveguide section 32 includes an output inner conductor 36 and an output outer conductor 38 that radially surrounds the output inner conductor 36, thereby forming an opening or channel 32' therebetween. Outer surfaces of the output inner conductor 36 and an inner surface of the output outer conductor 38 may have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. The output coaxial waveguide section 32, and in particular, the output outer conductor 38 may be attached to the second end 16" by way of outer mechanical fasteners 24, such as screws, bolts, or the like that engage with corresponding portions of the amplifier assemblies 22.

Each amplifier assembly 22 comprises an input antenna structure 48 and an output antenna structure 50, both of which are coupled to an amplifier 52. In certain embodiments, the amplifier 52 comprises a monolithic microwave integrated circuit (MMIC) amplifier. In further embodiments, the MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates along the channel 14' between the inner conductor 18 and the outer conductor 20 and concurrently provides the input signal 54 to the center waveguide section 16 in a radial manner. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The output antenna structures 50 collectively form an output antenna array 62 that operates to provide the amplified signal portions to be concurrently combined inside the opening of the output coaxial waveguide section 32 to form an amplified output signal $54_{AMP}$, which is then propagated along the channel 32' of the output coaxial waveguide section 32 to the output port 34.

Figure 1B:
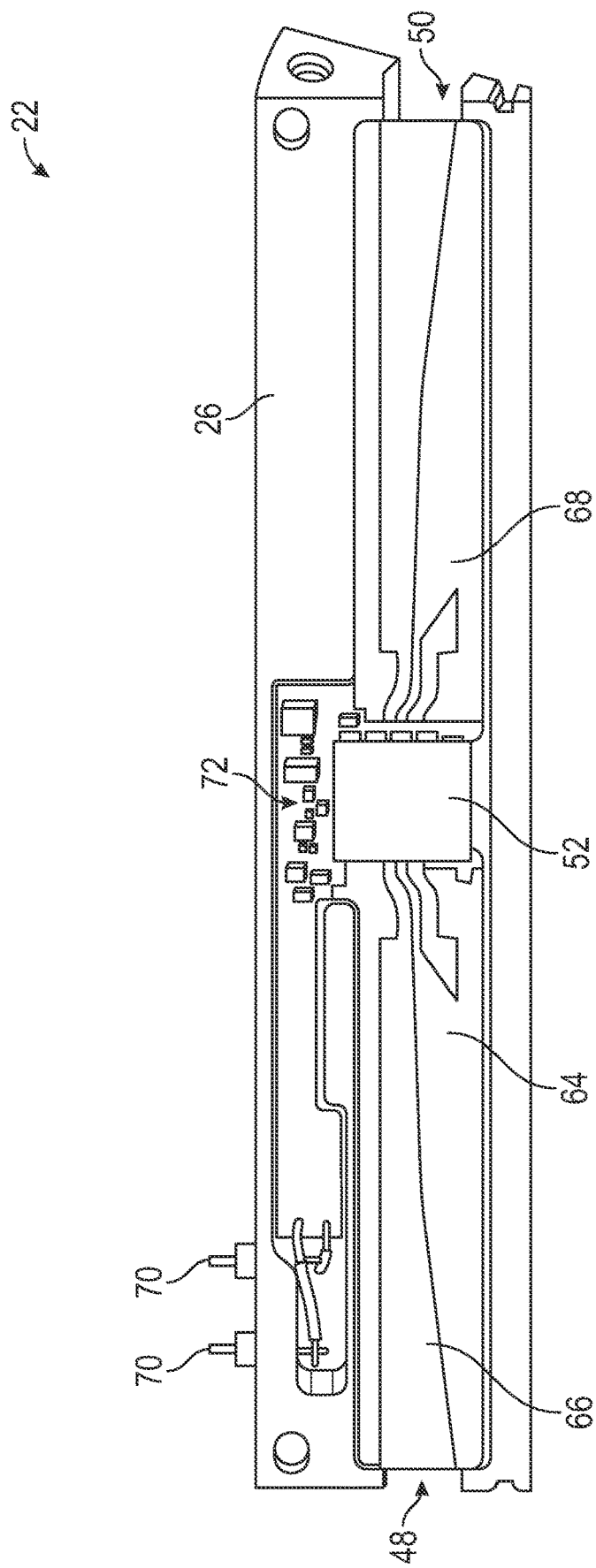
FIG. 1B is a perspective view of an individual amplifier assembly of the spatial power-combining device of FIG. 1A.

FIG. 1B is a perspective view of an individual amplifier assembly 22 of the spatial power-combining device 10 of FIG. 1A. The input antenna structure 48 may comprise an input signal conductor 64 supported on a first face of a substrate 66 or board, and the output antenna structure 50 comprises an output signal conductor 68 that is also supported on the first face of the substrate 66. The input signal conductor 64 and the output signal conductor 68 are electromagnetically coupled to the amplifier 52. The substrate 66 may comprise a printed circuit board that provides a desired form factor and mechanical support for the input signal conductor 64 and the output signal conductor 68. The input antenna structure 48 also includes an input ground conductor (not visible) on an opposing second face of the substrate 66 to the input signal conductor 64. In a similar manner, the output antenna structure 50 includes an output ground conductor (not visible) on the opposing second face of the substrate 66 to the output signal conductor 68. In other embodiments, the substrate 66 may be substituted with a plurality of substrates or boards. In still other embodiments, the input signal conductor 64, the input ground conductor (not visible), the output signal conductor 68, and the output ground conductor (not visible) are mechanically supported by the body structure 26 such that the substrate 66 may not be present. In certain embodiments, one or more ports 70 are provided for an external voltage input, such as from a direct current voltage source, and corresponding bias circuitry 72 is provided to control the amplifier 52. In certain embodiments, the bias circuitry 72 is arranged on the same substrate 66 as the antenna structures 48, 50. In other embodiments, a separate substrate may be provided for the bias circuitry 72.

In operation, a portion of the input signal (54 in FIG. 1A) is received by the input antenna structure 48 where it radiates between the input signal conductor 64 and the input ground conductor (not visible) and propagates to the amplifier 52 for amplification. For embodiments with a substrate 66, the portion of the input signal (54 in FIG. 1A) radiates between the input signal conductor 64 and the input ground conductor (not visible) through the substrate 66. For embodiments without a substrate 66, the portion of the input signal (54 in FIG. 1A) radiates between the input signal conductor 64 and the input ground conductor (not visible) through air. The amplifier 52 outputs a portion of the amplified signal (54$_{AMP}$ in FIG. 1A) to the output antenna structure 50 where it radiates between the output signal conductor 68 and the output ground conductor (not visible) in a similar manner.

Turning back to FIG. 1A, the spatial power-combining device 10 is typically utilized for high power-combining applications. Accordingly, the amplifier 52 in each of the amplifier assemblies 22 is configured for high power amplification and may therefore generate a high amount of heat. If the operating temperature of each amplifier 52 increases too much, the performance and lifetime of each amplifier 52 may suffer. As previously described, the plurality of amplifier assemblies 22 forms the center waveguide section 16. In this regard, thermal management is needed to effectively dissipate heat in and around the center waveguide section 16. Accordingly, the body structure 26 of each amplifier assembly 22 may typically comprise a thermally conductive material, such as copper (Cu), aluminum (Al), or alloys thereof that are configured to dissipate enough heat from the amplifier 52 to maintain a suitably low operating temperature. In certain applications, the body structure 26 may comprise graphite with an electrically conductive film, such as nickel (Ni), Cu, or combinations thereof. In still further embodiments, the body structure 26 may comprise metal-ceramic composites, including copper-diamond and/or aluminum-diamond.

In conventional spatial power-combining devices, the inner conductors of input and output coaxial waveguide sections may be mechanically attached to a separate support element, such as a center post by way of one or more mechanical fasteners arranged between the center post and the inner conductors. Amplifier assemblies may be stacked circumferentially around the center post and may have inner surfaces that conform to the outer shape of the center post. Accordingly, the conventional center post is provided for mechanical support and assembly in conventional spatial power-combining devices. While providing mechanical support for the radially arranged amplifier assemblies, the presence of the center post may occupy space within a spatial power-combining device that may limit overall dimensions.

According to aspects of the present disclosure, various mechanical support structures are provided that allow removal of conventional center post arrangements. As previously described, mechanical support in the spatial power-combining device 10 of FIG. 1A comprises mechanically attaching the input outer conductor 20 to the input end 16' and mechanically attaching the output outer conductor 38 to the output end 16". According to aspects of the present disclosure, a separate support element, such as a center rod or post, is not required for assembly. Removing the conventional center post structure may have particular benefit for applications that include higher frequency operation with shorter wavelengths of electromagnetic radiation and increased bandwidth. For these applications, it may be preferable for the spatial power-combining device 10 to have smaller dimensions. Accordingly, the spacing of amplifier assemblies 22 relative to each other along the center axis may be reduced. Removing the conventional center post structure may also provide other benefits, regardless of intended operating frequencies, such as reduced costs, reduced and/or improved mechanical connections, easier assembly, and common designs that are scalable across multiple frequency bands As will be described in greater detail below, mechanical support structures that allow removal of conventional center posts may include mechanical structures, such as bolt structures, that directly couple the opposing inner conductors 18 and 36. Other mechanical support structures that allow removal of conventional center posts include integrated mechanical structures within the center waveguide section 16, such as nut structures formed by the amplifier assemblies 22, compression fit arrangements for the coaxial waveguide sections 14 and 32, and dielectric inserts within portions of the coaxial waveguide sections 14 and 32.

Figure 2:
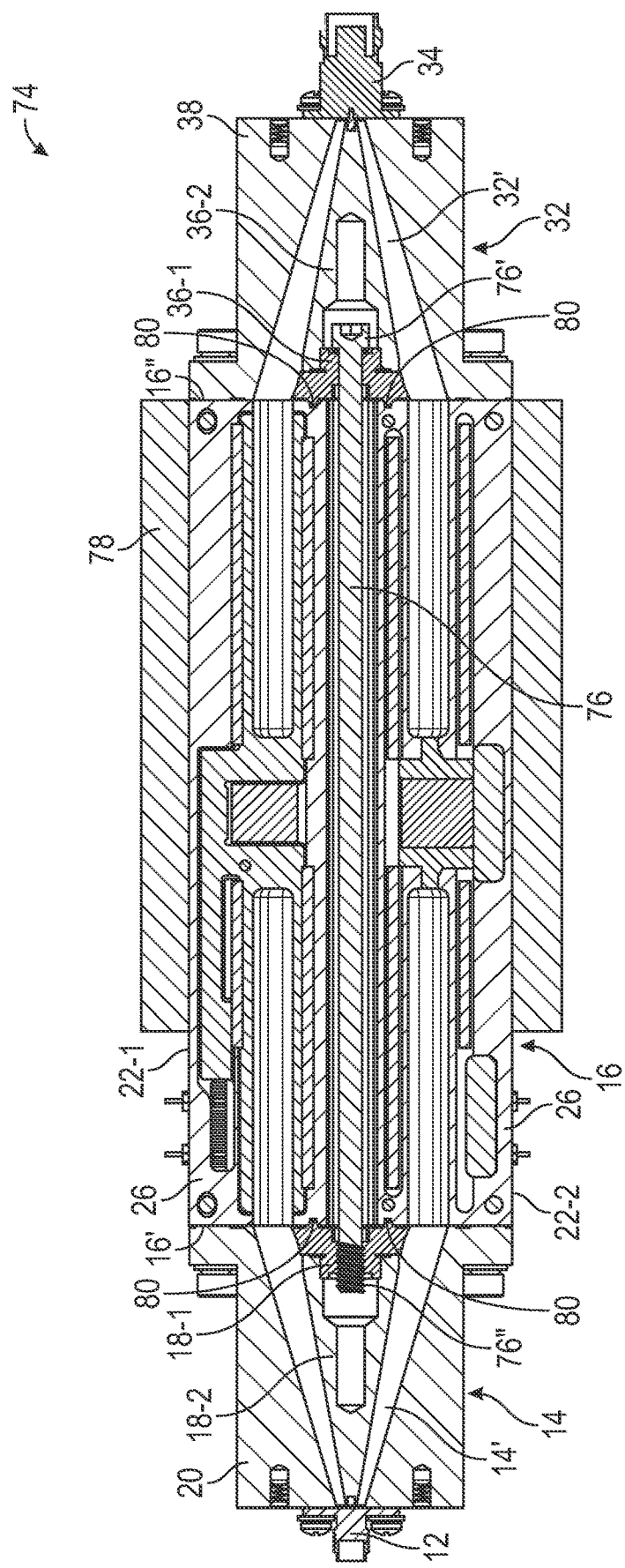
FIG. 2 is a partial cross-sectional view of a spatial power-combining device that is similar to the spatial-power combining device of FIGS. 1A and 1B, and further includes a bolt that extends through the center waveguide section and mechanically connects with both the input coaxial waveguide section and the output coaxial waveguide section.

FIG. 2 is a partial cross-sectional view of a spatial power-combining device 74 that is similar to the spatial-power combining device 10 of FIGS. 1A and 1B, and further includes a bolt 76 that extends through the center waveguide section 16 and mechanically connects with both the input coaxial waveguide section 14 and the output coaxial waveguide section 32. In the cross-sectional view, amplifier assemblies 22-1 and 22-2 are visible while other amplifier assemblies are omitted for illustrative purposes. For illustrative purposes, the input antenna structure 48, the output antenna structure 50, and the amplifier 52 of FIGS. 1A and 1B, among other elements are omitted; however, unless otherwise specified, it is understood that the amplifier assemblies 22-1, 22-2 of FIG. 2 include the features of FIG. 1B. Both the input end 16' and the output end 16" of the plurality of amplifier assemblies 22-1, 22-2 are visible within the center waveguide section 16. The input port 12 and input coaxial waveguide section 14 are located adjacent the input end 16', and the output port 34 and the output coaxial waveguide section 32 are located adjacent the output end 16". A thermal structure 78, such as a heat sink may be arranged around at least a portion of the center waveguide section 16. The input coaxial waveguide section 14 comprises first and second input inner conductor portions 18-1, 18-2, referred to collectively as the input inner conductor 18, and the input outer conductor 20, and the output coaxial waveguide section 32 comprises first and second output inner conductor portions 36-1, 36-2, referred to collectively as the output inner conductor 36, and the output outer conductor 38. In conventional devices, a center post may be typically employed that is arranged with amplifier assemblies 22-1 to 22-2 of the center waveguide section 16 and is attached to the input and output coaxial waveguide sections 14, 32, by way of additional mechanical fasteners. By arranging the bolt 76 that extends entirely through both ends 16' and 16" of the center waveguide section 16, a number of mechanical connections in the spatial power-combining device 74 may be reduced to provide lower costs, easier assembly, and an overall structure that is more readily scalable in size to accommodate different operating frequency bands.

Depending on the embodiment, the input inner conductor portions 18-1, 18-2 may form a single unitary element or separate elements or portions that are attached to one another to collectively form the input inner conductor 18. In a similar manner, the output inner conductor portions 36-1, 36-2 may be form a single unitary structure or separate elements or portions that are attached to one another to collectively form the output inner conductor 36. As illustrated, the bolt 76 is at least partially arranged within the center waveguide section 16 such that the plurality of amplifier assemblies 22-1, 22-2 are arranged radially around the bolt 76. A head 76' of the bolt 76 is fixed within the output coaxial waveguide section 32 and a threaded portion 76" of the bolt is threaded into the input coaxial waveguide section 14. In alternative arrangements, the order may be reversed such that the head 76' of the bolt 76 is fixed within the input coaxial waveguide section 14 and the threaded portion 76" of the bolt is threaded into the output coaxial waveguide section 32. In certain embodiments, one or more of the amplifier assemblies 22-1 to 22-2 may form an alignment notch 80 in the body structure 26 that is arranged to receive a corresponding protruding feature of either the input inner conductor portion 18-1 or the output inner conductor portion 36-1.

For embodiments where the output inner conductor 36 is formed of the separate portions 36-1 and 36-2 that are attached to one another, the head 76' may be secured to the first portion 36-1 of the output inner conductor 36 while the second portion 36-2 of the output inner conductor 36 may enclose the head 76'. In this manner, the head 76' may be arranged between the first portion 36-1 and the second portion 36-2 of the output inner conductor 36. The threaded portion 76" of the bolt 76, which is located on an opposite end of the bolt 76 from the head 76', may be threaded into the input inner conductor 18. For embodiments where the input inner conductor 18 is formed of separate portions 18-1 and 18-2 that are attached to one another, the threaded portion 76" may be secured to the first portion 18-1. In further embodiments, the threaded portion 76" may extend entirely through the first portion 18-1 such that the threaded portion 76" may also be secured to the second portion 18-2 of the input inner conductor 18. In either arrangement, the threaded portion 76" may be enclosed within the input inner conductor 18. In certain embodiments, any number of mechanical fasteners, such as a screw or a threaded rod may be implemented in place of the bolt 76 as illustrated in FIG. 2.

Figure 3A:
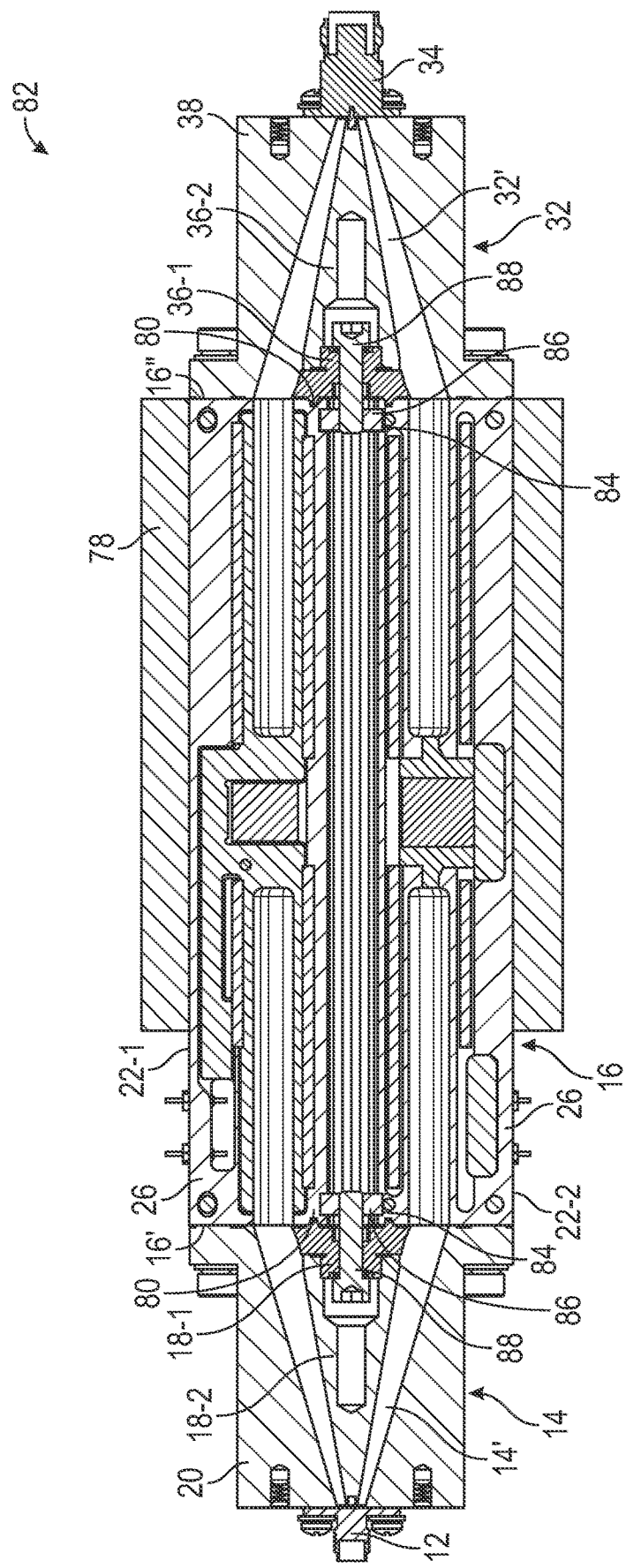
FIG. 3A is a partial cross-sectional view of a spatial power-combining device that is similar to the spatial-power combining device of FIG. 2, but where the body of each amplifier assembly forms one or more slots shaped to hold a nut that mechanically engages with a mechanical fastener from either the input or output coaxial waveguide sections.
Figure 3B:
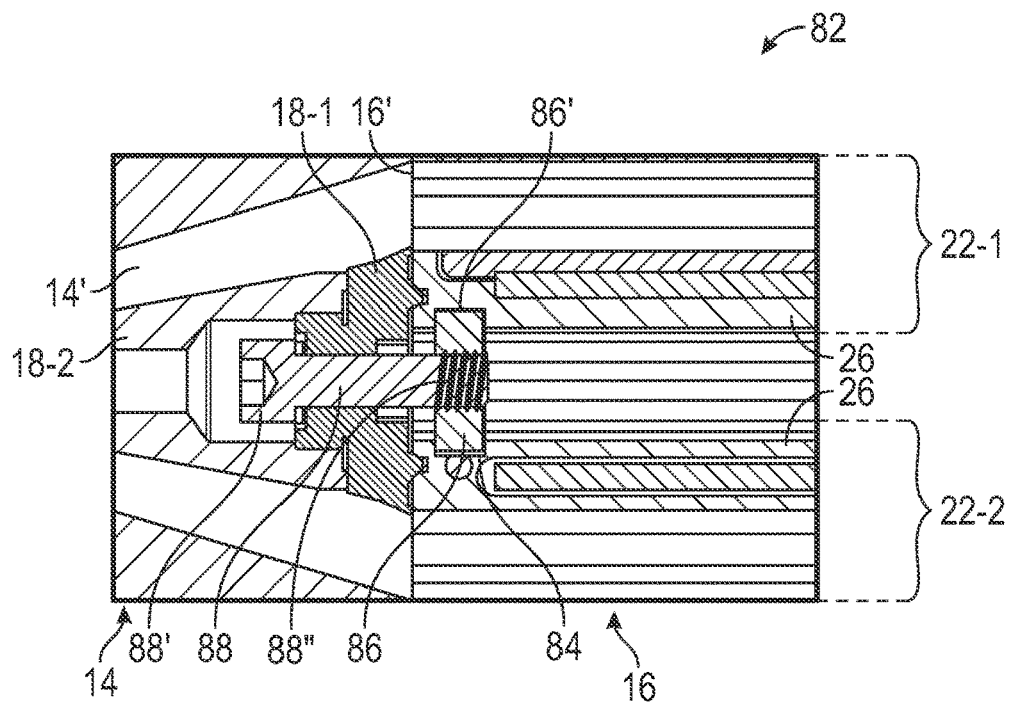
FIG. 3B is an expanded view of the spatial power-combining device of FIG. 3A.

FIG. 3A is a partial cross-sectional view of a spatial power-combining device 82 that is similar to the spatial power-combining device 74 of FIG. 2, but where the body structure 26 of each amplifier assembly 22-1, 22-2 forms one or more slots 84 shaped to hold a nut 86 that mechanically engages with a mechanical fastener 88 from either the input or output coaxial waveguide sections 14, 32. FIG. 3B is an expanded view of the spatial power-combining device 82. As illustrated, the slots 84 are formed within the body structure 26 in an arrangement that is spaced from the first end 16' of the center waveguide section 16. The slots 84 from each of the amplifier assemblies 22-1, 22-2 collectively form a radial groove or cavity of the amplifier assemblies 22-1, 22-2 that receives and secures the nut 86 when the amplifier assemblies 22-1, 22-2 are assembled together to form the center waveguide section 16. In certain embodiments, a total number of planar lateral edges 86' of the nut 86 may be the same as a total number of the amplifier assemblies 22-1, 22-2. For example, if the spatial power-combining device 82 comprises eight amplifier assemblies 22-1, 22-2 radially arranged to form the center waveguide section 16, the nut 86 may have a corresponding eight planar lateral edges 86'. In other embodiments, the total number of planar lateral edges 86' of the nut 86 may be the less than the total number of the amplifier assemblies 22-1, 22-2. With the nut 86 in place, a mechanical fastener 88 may be arranged to secure the input coaxial waveguide section 14, and in particular, the input inner conductor portion 18-1.

The mechanical fastener 88 may embody a bolt that is similar to the bolt 76 described above for FIG. 2, however, the mechanical fastener 88 only extends partially into the center waveguide section 16 to engage the nut 86. In this manner, a head 88' of the mechanical fastener 88 may be arranged between the first portion 18-1 and the second portion 18-2 of the input inner conductor 18 within the input coaxial waveguide section 14. A threaded portion 88" of the mechanical fastener 88 engage with the nut 86. As illustrated in FIG. 3A, another arrangement of slots 84, another nut 86, and another mechanical fastener 88 may also be arranged to fasten the second end 16" of the center waveguide section 16 to the output inner conductor 36 of the output coaxial waveguide section 32. In addition to a bolt, the mechanical fasteners 88 may embody screws or threaded rods, among others.

Figure 4:
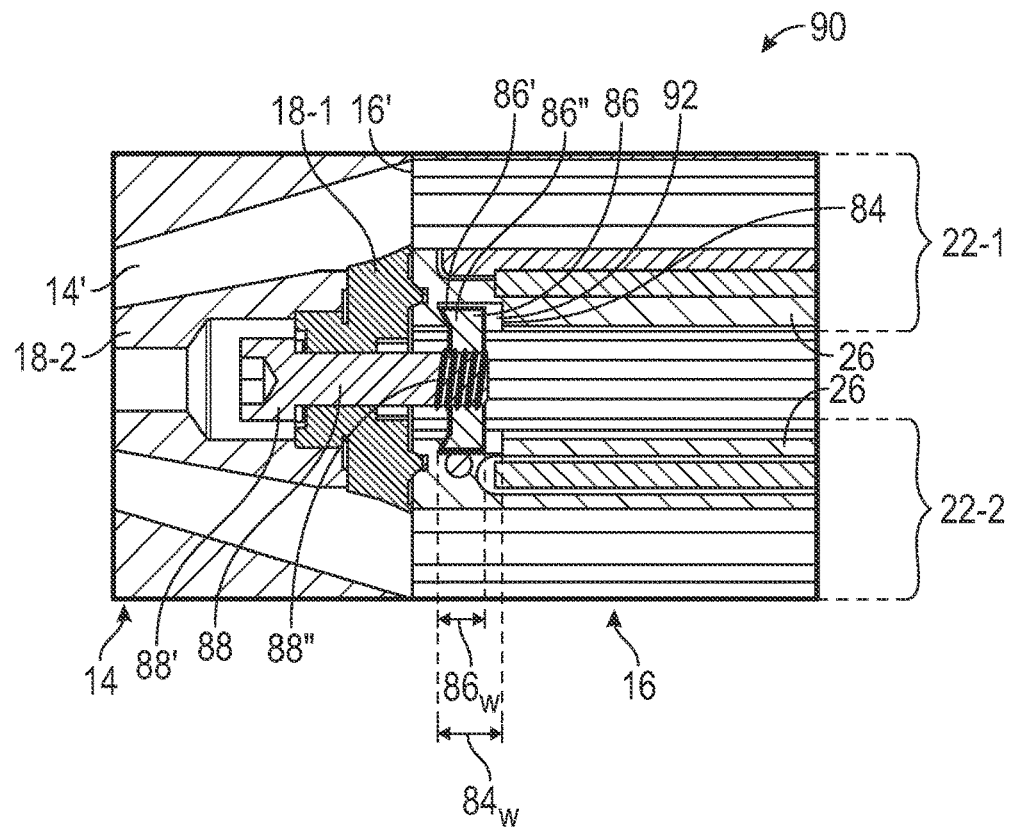
FIG. 4 is an expanded view of a spatial power-combining device that is similar to the spatial power-combining device of FIGS. 3A and 3B, but where a width of the slot is larger than a corresponding width of the nut such that a gap is formed in the slot.

FIG. 4 is an expanded view of a spatial power-combining device 90 that is similar to the spatial power-combining device 82 of FIGS. 3A and 3B, but where a width 84w of the slot 84 is larger than a corresponding width 86w of the nut 86 to form a gap 92. When the width 84w of the slot 84 is larger than the corresponding width 86w of the nut 86, the gap 92 may be formed in the slot 84 when the nut 86 is tightened to the mechanical fastener 88. In certain embodiments, the nut 86 may be formed with a protruding feature 86" that is oriented toward the input coaxial waveguide section 14. By having the width 84w of the slot 84 larger than the width 86w of the nut 86, the nut 86 may have sufficient room to be arranged within the slot 84 while also accommodating the protruding feature 86". When the mechanical fastener 88 is tightened to the nut 86, the protruding feature 86" may serve to apply an inward force on the edges of the amplifier assemblies 22-1, 22-2 at the first end 16', wherein the inward force is generally applied in a direction toward a center axis of the spatial power-combining device 90 where the mechanical fastener 88 resides. In this regard, any unintended separation of edges of the amplifier assemblies 22-1, 22-2 from the mechanical fastener 88 during tightening of the mechanical fastener 88 to the nut 86 may be avoided or reduced.

Figure 5:
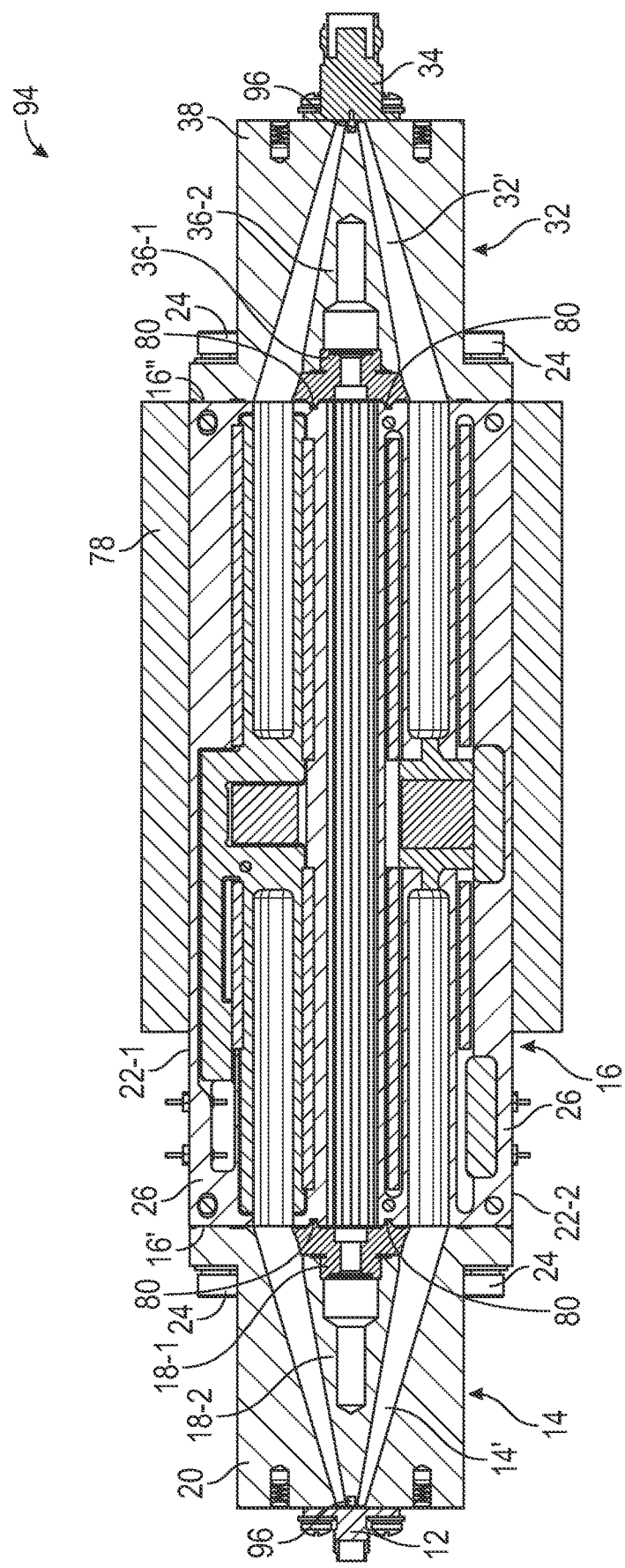
FIG. 5 is a partial cross-sectional view of a spatial power-combining device that is similar to the spatial-power combining device of FIG. 2, but where the input inner conductor of the input coaxial waveguide and the output inner conductor of the output coaxial waveguide are mechanically attached to the center waveguide section by only a compression fit connection.

FIG. 5 is a partial cross-sectional view of a spatial power-combining device 94 that is similar to the spatial power-combining device 74 of FIG. 2, but where the input inner conductor portions 18-1, 18-2 of the input coaxial waveguide 14 and the output inner conductor portions 36-1, 36-2 of the output coaxial waveguide 32 are mechanically attached to the center waveguide section 16 by only a compression fit connection. In this regard, when the outer mechanical fasteners 24 are provided to secure the input coaxial waveguide section 14, and in particular, the input outer conductor 20, to the center waveguide section 16, the alignment notch 80 in the body structure 26 and the corresponding protruding feature of the input inner conductor portion 18-1 are engaged. A pin 96 may serve to mechanically couple the input outer conductor 20 to the input inner conductor 18. This arrangement may serve to fix and align the input coaxial waveguide section 14 in place. Accordingly, the input inner conductor 18 is effectively held in place by only a compression fit connection provided by a combination or various subcombinations of the outer mechanical fasteners 24, the input outer conductor 20, the alignment notch 80 and corresponding protruding feature of the input inner conductor portion 18-1, and the pin 96, thereby further simplifying assembly of the spatial power-combining device 94. This arrangement may have particular benefit that would allow the spatial power-combining device 94 to be formed with a lighter weight and a reduced size, especially for higher frequency applications.

Figure 6:
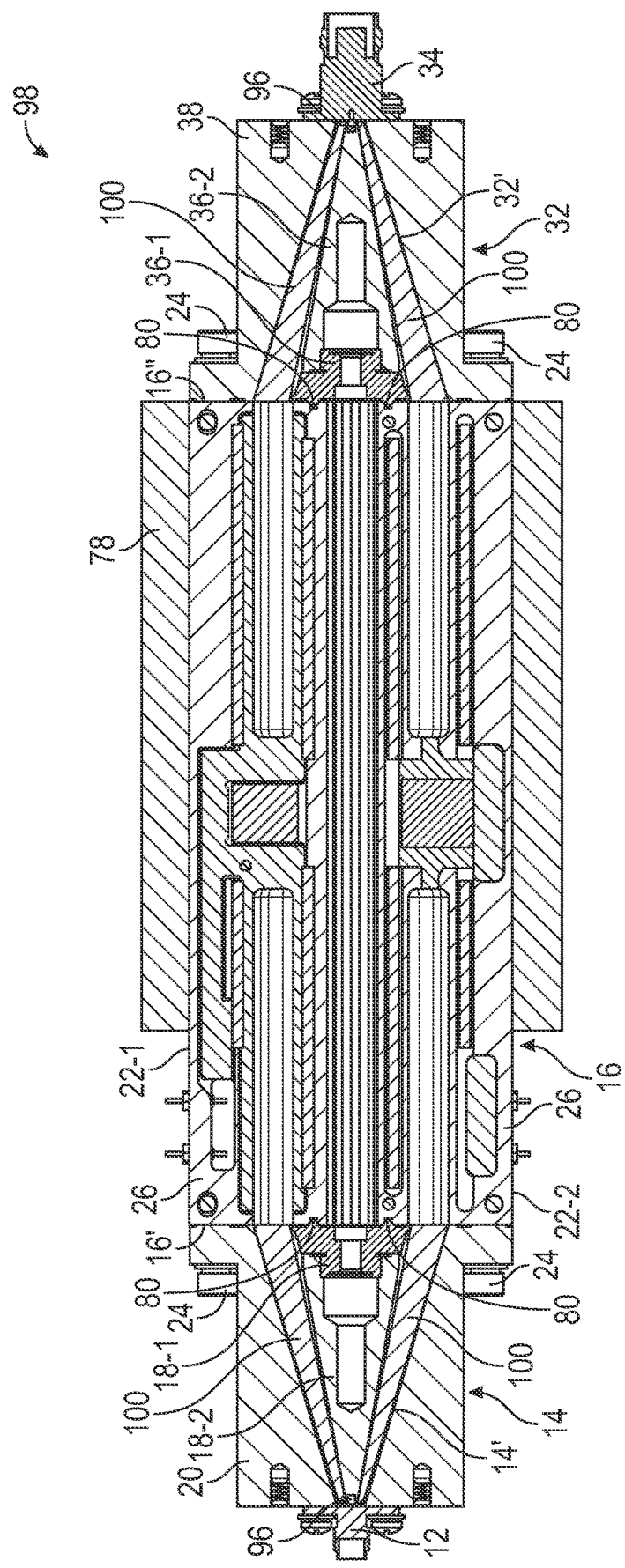
FIG. 6 is a partial cross-sectional view of a spatial power-combining device that is similar to the spatial-power combining device of FIG. 5, but where a dielectric insert is arranged within the channel between the input inner conductor and the input outer conductor to provide improved alignment and/or mechanical support.

FIG. 6 is a partial cross-sectional view of a spatial power-combining device 98 that is similar to the spatial power-combining device 94 of FIG. 5, but where a dielectric insert 100 is arranged within the channel 14' between the input inner conductor 18 and the input outer conductor 20. Alternatively, or in combination with the dielectric insert 100 in the channel 14', another dielectric insert 100 may be arranged within the channel 32' between the output inner conductor 36 and the output outer conductor 38. The dielectric insert 100 may be provided to serve as a positioner and/or to provide mechanical support within the channels 14', 32'. The dielectric insert 100 may be utilized alone or in combination with any of the previously described embodiments to maintain alignment of the channels 14', 32' with the various mechanical connections. In certain embodiments, the dielectric insert 100 may comprise polytetrafluoroethylene (PTFE), such as Teflon or Rulon, among others. In such arrangements, the dielectric insert 100 is configured to form at least a portion of a medium in which a signal propagates through the input coaxial waveguide section 14 and/or the output coaxial waveguide section 32. As illustrated in FIG. 6, the dielectric insert 100 may be arranged to occupy the entire channels 14' and 32'. While the presence of the dielectric insert 100 may provide additional alignment and/or mechanical support, it could result in some operating losses when signals are propagating through the channels 14', 32'. In this regard, other embodiments are described below where the dielectric insert 100 occupies only a portion of the channels 14', 32'.

Figure 7:
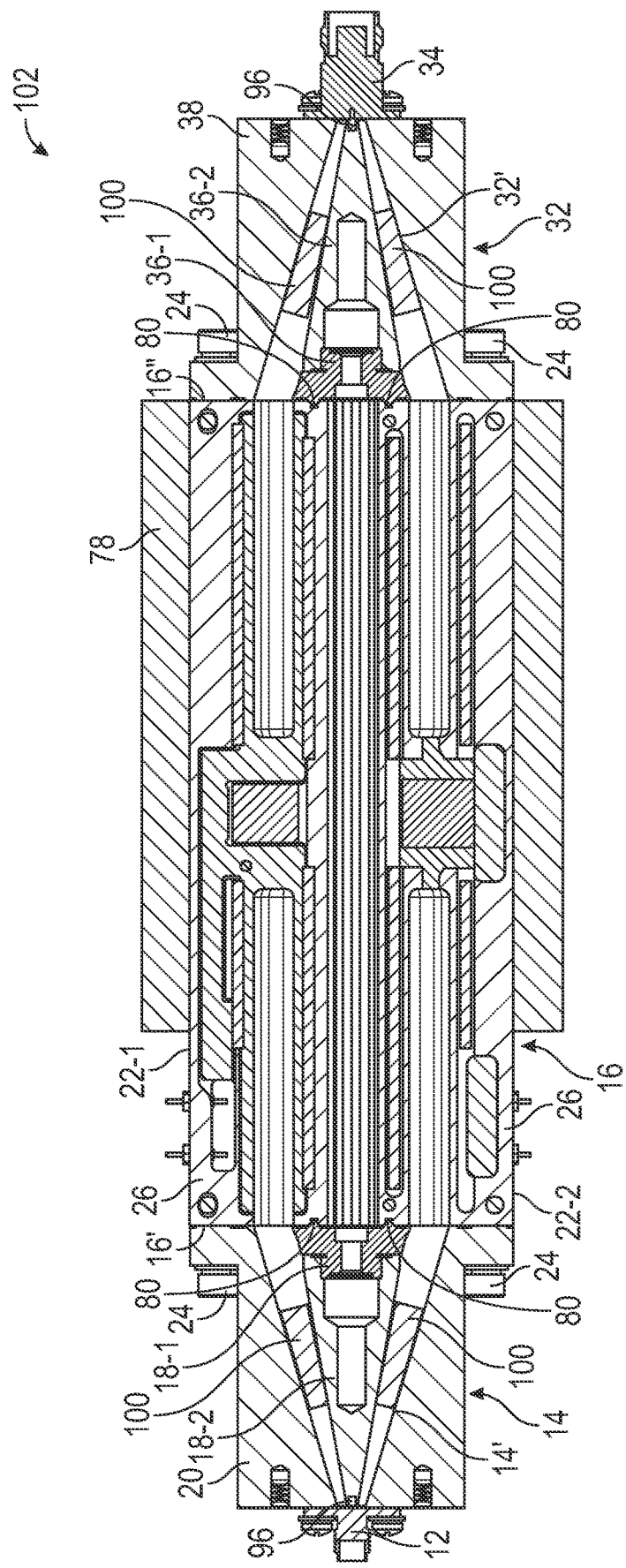
FIG. 7 is a partial cross-sectional view of a spatial power-combining device that is similar to the spatial-power combining device of FIG. 6, but where the dielectric insert forms a band that occupies only a portion of the channels.

FIG. 7 is a partial cross-sectional view of a spatial power-combining device 102 that is similar to the spatial power-combining device 98 of FIG. 6, but where the dielectric insert 100 forms a band that occupies only a portion of the channels 14', 32'. In this regard, the channels 14', 32' may be formed with a combination of the dielectric insert 100 and air. In FIG. 7, the dielectric insert 100 is illustrated as forming the band along a center portion of the channels 14', 32', although the band may be formed in other portions of the channels 14', 32' that are offset from the center portion. By providing the dielectric insert 100 in only a portion of the channels 14', 32', the alignment and/or mechanical support improvements described above may be realized while also reducing losses that may be associated with the presence of the dielectric insert 100.

Figure 8:
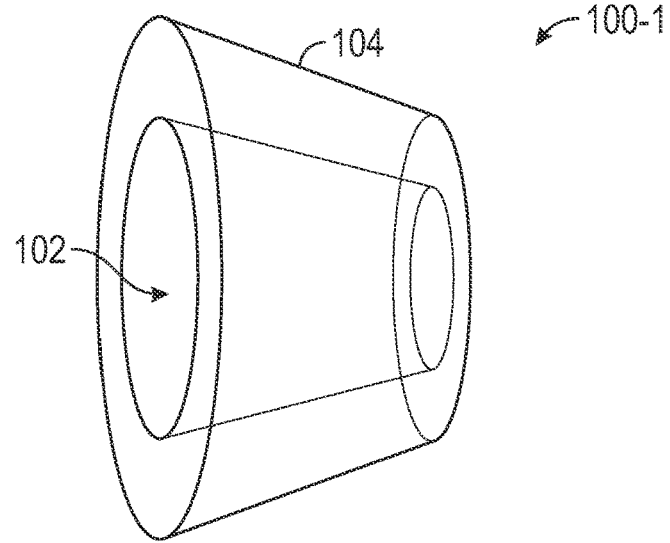
FIG. 8 is a perspective view of a dielectric insert that is similar to the dielectric insert that forms a band of FIG. 7.
Figure 9:
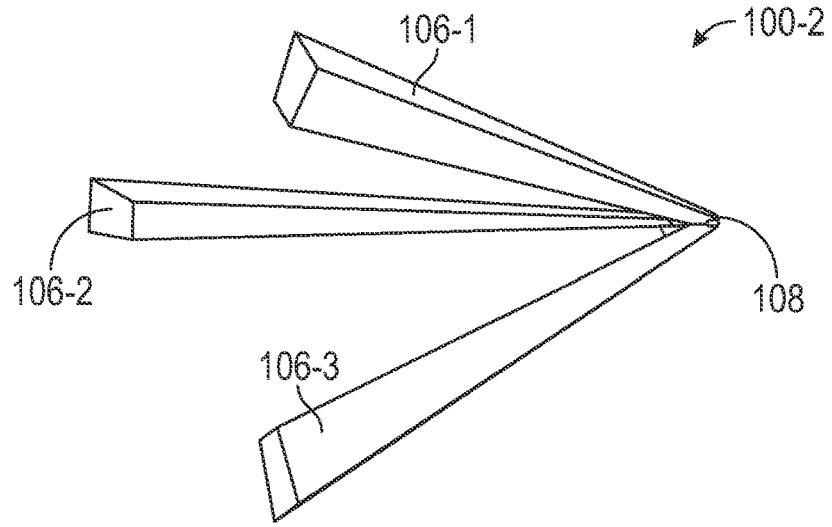
FIG. 9 is a perspective view of a dielectric insert arrangement that includes multiple tines that branch apart such that when the dielectric insert is provided in a channel of a coaxial waveguide section, air may be provided within the channel and between the tines.
Figure 10:
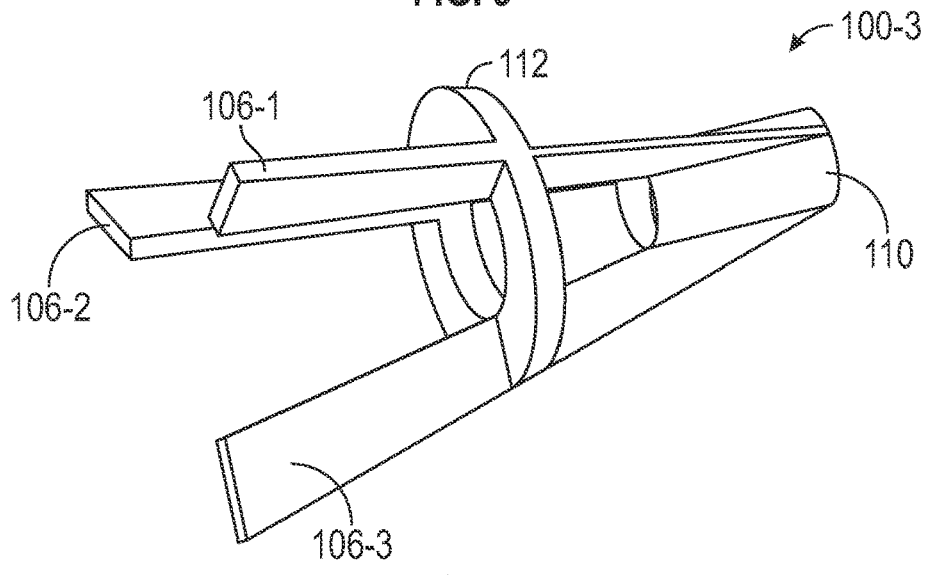
FIG. 10 is a perspective view of a dielectric insert arrangement that is similar to the dielectric insert of FIG. 9 and further includes one or more bands that for added alignment and/or mechanical support.

FIGS. 8 to 10 illustrate various arrangements of dielectric inserts 100-1 to 100-3 that may serve to provide improved alignment and/or mechanical support while also only occupying a portion of the channels 14', 32' of FIG. 7 for reducing associated losses. The dielectric insert 100-1 of FIG. 8 may be similar to the dielectric insert 100 of FIG. 7. As illustrated, the dielectric insert 100-1 may form a band with an opening 104 that is arranged to receive a portion of either the input inner conductor 18 or the output inner conductor 36. An outer surface 106 of the dielectric insert 100-1 may form a shape that corresponds with an inner shape of either the input outer conductor 20 or the output outer conductor 38. Rather than a band structure, the dielectric insert 100-2 of FIG. 9 is formed with a plurality of tines or prongs 108-1 to 108-3 that branch apart from a center portion 110. In this manner, the plurality of tines 108-1 to 108-3 may extend through various portions of the channels 14', 32' of FIG. 7 while allowing air to reside within other portions of the channels 14', 32' that are between the tines 108-1 to 108-3. For the dielectric insert 100-3 of FIG. 10, the plurality of tines 108-1 to 108-3 may be coupled by one or more of a first band 112 and a second band 114 that are arranged to reside within different portions of the channels 14', 32' of FIG. 7. In this manner, the first band 112 and/or the second band 114 may provide mechanical support and/or alignment for positioning of the tines 108-1 to 108-3 relative to one another while also providing added mechanical support and/or alignment of the channels 14', 32' of FIG. 7.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising:
 a center waveguide section comprising a plurality of amplifier assemblies, wherein the plurality of amplifier assemblies form a first end and a second end;
 a first coaxial waveguide section attached to the first end, the first coaxial waveguide section comprising a first outer conductor and a first inner conductor that form a first channel therebetween;
 a second coaxial waveguide section attached to the second end, the second coaxial waveguide section comprising a second outer conductor and a second inner conductor that form a second channel therebetween, the second inner conductor comprising a first portion and a second portion that are separate elements attached to one another; and
 a mechanical fastener at least partially arranged within the center waveguide section such that the plurality of amplifier assemblies are arranged radially around the mechanical fastener, wherein a threaded portion of the mechanical fastener is threaded into the first coaxial waveguide section and a head of the mechanical fastener is fixed between the first portion and the second portion of the second inner conductor such that the head of the mechanical fastener is enclosed by the second portion of the second inner conductor within the second coaxial waveguide section.

2. The spatial power-combining device of claim 1, wherein the threaded portion of the mechanical fastener is secured to the first inner conductor.

3. The spatial power-combining device of claim 2, wherein:
the first inner conductor comprises a first portion and a second portion that is attached to the first portion; and
the threaded portion of the mechanical fastener is secured to the first portion of the first inner conductor.

4. The spatial power-combining device of claim 3, wherein the threaded portion of the mechanical fastener is secured to both the first portion and the second portion of the first inner conductor.

5. The spatial power-combining device of claim 1, wherein each amplifier assembly of the plurality of amplifier assemblies comprises an input antenna structure, an amplifier, and an output antenna structure.

6. The spatial power-combining device of claim 1, wherein the mechanical fastener comprises a bolt.

7. The spatial power-combining device of claim 1, wherein one or more amplifier assemblies of the plurality of amplifier assemblies comprise an alignment notch, and the first portion of the second inner conductor comprises a protrusion that is received in the alignment notch.

8. A spatial power-combining device comprising:
a center waveguide section comprising a plurality of amplifier assemblies, wherein the plurality of amplifier assemblies form a first end and a second end;
a first coaxial waveguide section attached to the first end, the first coaxial waveguide section comprising a first outer conductor and a first inner conductor that form a first channel therebetween, the first inner conductor comprising a first portion and a second portion that are separate elements and the second portion is attached to the first portion;
a second coaxial waveguide section attached to the second end, the second coaxial waveguide section comprising a second outer conductor and a second inner conductor that form a second channel therebetween; and
a mechanical fastener at least partially arranged within the center waveguide section such that the plurality of amplifier assemblies are arranged radially around the mechanical fastener, wherein a threaded portion of the mechanical fastener is threaded into and secured to the first portion of the first inner conductor and a head of the mechanical fastener is fixed and enclosed within the second inner conductor of the second coaxial waveguide section.

9. The spatial power-combining device of claim 8, wherein the threaded portion of the mechanical fastener extends entirely through the first portion of the first inner conductor.

10. The spatial power-combining device of claim 9, wherein the threaded portion of the mechanical fastener is secured to both the first portion and the second portion of the first inner conductor.

11. The spatial power-combining device of claim 10, wherein the threaded portion of the mechanical fastener is enclosed by the second portion of the first inner conductor within the first inner conductor.

12. The spatial power-combining device of claim 8, wherein one or more amplifier assemblies of the plurality of amplifier assemblies comprise an alignment notch, and the first portion of the first inner conductor comprises a protrusion that is received in the alignment notch.

* * * * *